(12) United States Patent  
Reinberg

(10) Patent No.: US 6,873,050 B2
(45) Date of Patent: Mar. 29, 2005

(54) INTERMEDIATE CONSTRUCTION HAVING AN EDGE DEFINED FEATURE

(75) Inventor: Alan R. Reinberg, Westport, CT (US)

(73) Assignee: Micron Technology, Inc., Boise, ID (US)

( * ) Notice: Subject to any disclaimer, the term of this patent is extended or adjusted under 35 U.S.C. 154(b) by 325 days.

(21) Appl. No.: 09/851,634

(22) Filed: May 8, 2001

(65) Prior Publication Data

US 2002/0163061 A1 Nov. 7, 2002

Related U.S. Application Data

(62) Division of application No. 09/561,794, filed on May 1, 2000, which is a division of application No. 09/444,280, filed on Nov. 19, 1999, now Pat. No. 6,232,229.

(51) Int. Cl.$^7$ .............................................. H01L 29/34
(52) U.S. Cl. ................... 257/751; 257/486; 257/586; 257/623; 257/618; 257/622; 257/329; 257/403; 257/759; 257/760; 257/758
(58) Field of Search ................... 257/486, 586, 257/623, 618, 622, 329, 403, 751–764; 438/669, 412, 459, 713

(56) References Cited

U.S. PATENT DOCUMENTS

| 3,897,274 A | * | 7/1975 | Stehlin et al. ............. 438/407 |
| 4,007,104 A |  | 2/1977 | Summers et al. |
| 4,027,323 A |  | 5/1977 | Lorenze, Jr. et al. |
| 4,104,086 A |  | 8/1978 | Bondur et al. |
| 4,290,831 A |  | 9/1981 | Ports et al. |
| 4,571,818 A | * | 2/1986 | Robinson et al. ........... 438/404 |
| 4,622,574 A |  | 11/1986 | Garcia |
| 4,778,583 A |  | 10/1988 | Wagner et al. |
| 4,904,609 A |  | 2/1990 | Temple |
| 4,942,449 A | * | 7/1990 | Wei et al. .................... 257/396 |
| 5,045,505 A | * | 9/1991 | Kimura ....................... 438/140 |
| 5,127,989 A |  | 7/1992 | Haraguchi et al. |
| 5,322,748 A |  | 6/1994 | Watakabe et al. |
| 5,487,962 A | * | 1/1996 | Rolfson .......................... 430/5 |
| 5,658,440 A |  | 8/1997 | Templeton et al. |
| 5,671,243 A | * | 9/1997 | Yap ............................... 372/50 |
| 5,674,779 A |  | 10/1997 | Tijburg et al. |
| 5,837,058 A | * | 11/1998 | Chen et al. .................. 118/728 |
| 5,843,845 A |  | 12/1998 | Chung |
| 5,923,051 A |  | 7/1999 | Harris et al. |
| 5,962,866 A |  | 10/1999 | DiIorio et al. |
| 6,040,618 A | * | 3/2000 | Akram .......................... 257/586 |
| 6,075,280 A | * | 6/2000 | Yung et al. .................. 257/620 |
| 6,087,199 A | * | 7/2000 | Pogge et al. ................. 438/106 |
| 6,114,188 A |  | 9/2000 | Oliver et al. |
| 6,148,012 A |  | 11/2000 | Capasso et al. |
| 6,265,256 B1 |  | 7/2001 | An et al. |
| 6,339,257 B1 |  | 1/2002 | Fujiki et al. |

FOREIGN PATENT DOCUMENTS

JP  6-120483  *  4/1994  ............... 438/129

* cited by examiner

*Primary Examiner*—Alexander Oscar Williams
(74) *Attorney, Agent, or Firm*—Wells St. John P.S.

(57) ABSTRACT

An intermediate construction of an integrated circuit includes a semiconductive substrate and a raised mandril over the substrate. The raised mandril may be raised out from the substrate and have at least one edge substantially perpendicular to the substrate and at least one beveled edge. A layer of structural material may form an edge defined feature on the at least one perpendicular edge.

24 Claims, 9 Drawing Sheets

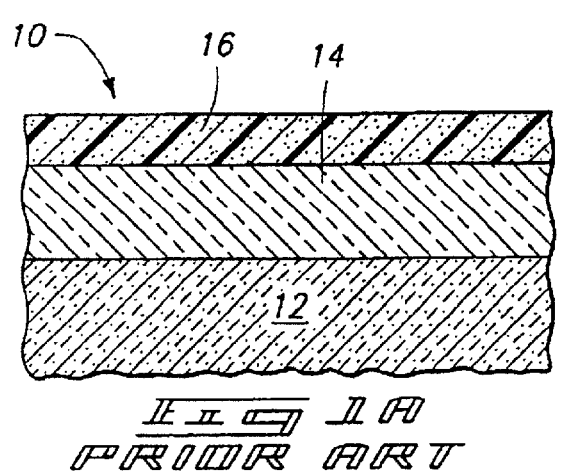
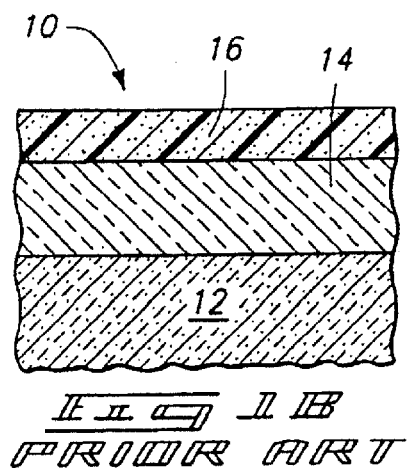
Fig 1A PRIOR ART
Fig 1B PRIOR ART
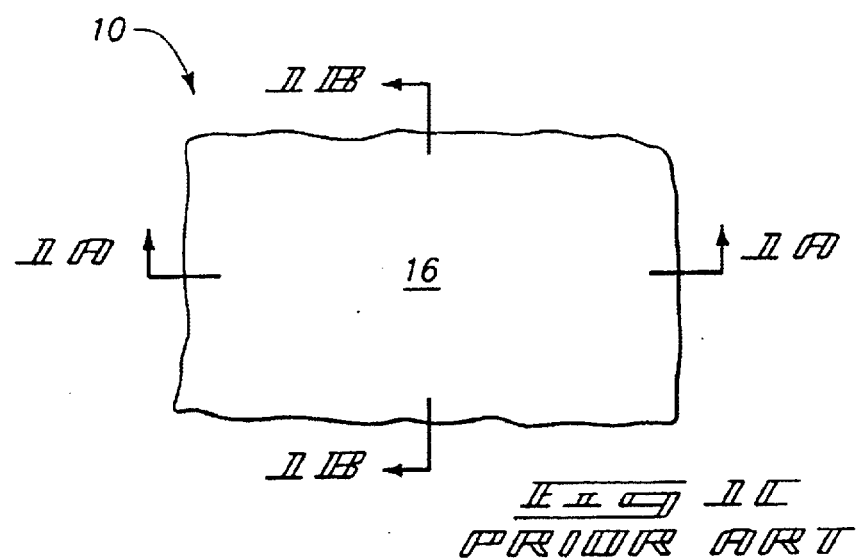
Fig 1C PRIOR ART
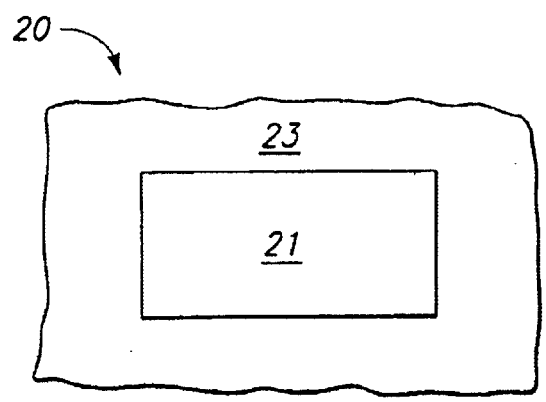
Fig 2 PRIOR ART

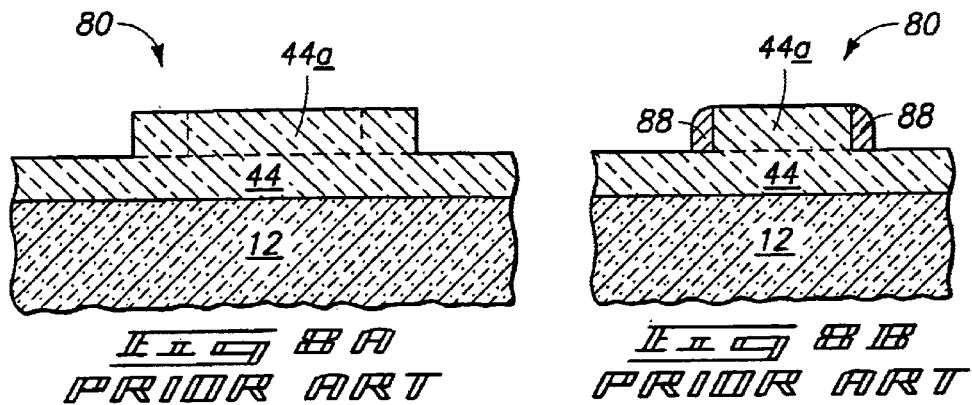
FIG. 8A PRIOR ART
FIG. 8B PRIOR ART
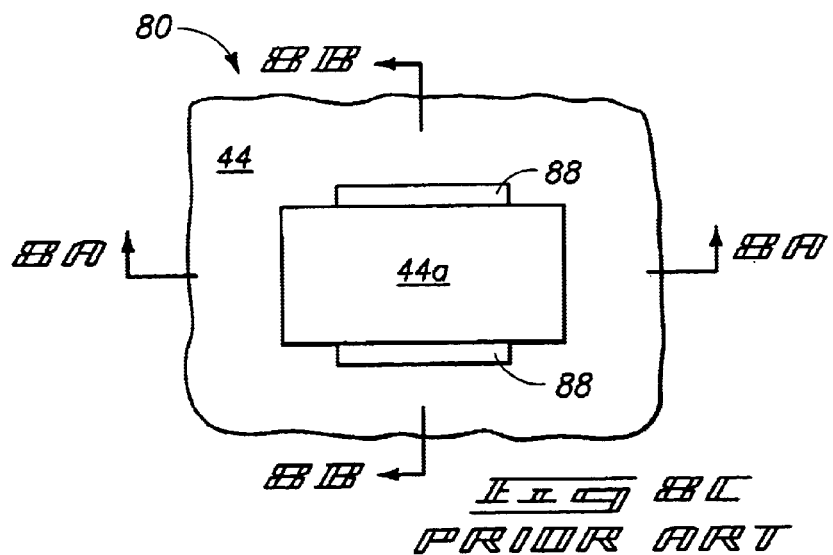
FIG. 8C PRIOR ART
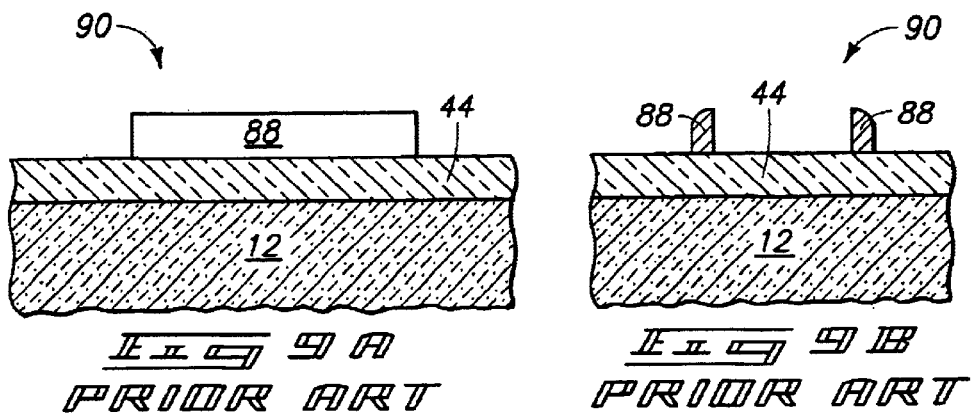
FIG. 9A PRIOR ART
FIG. 9B PRIOR ART

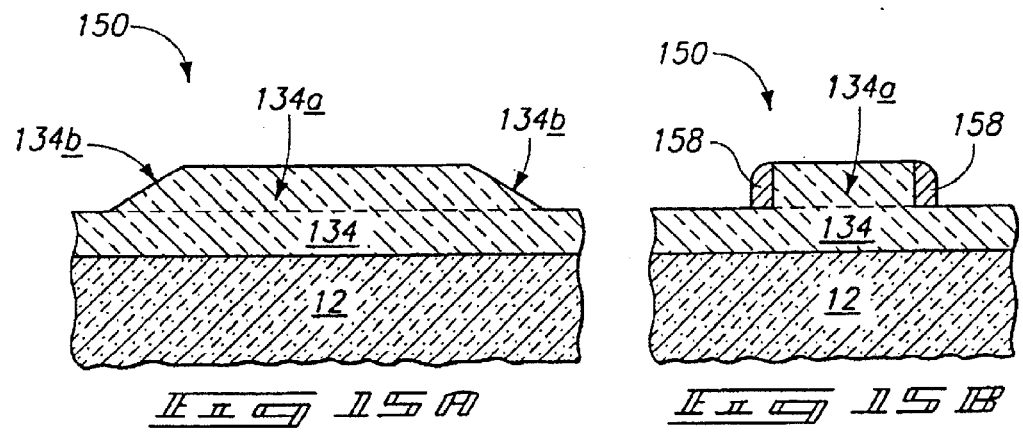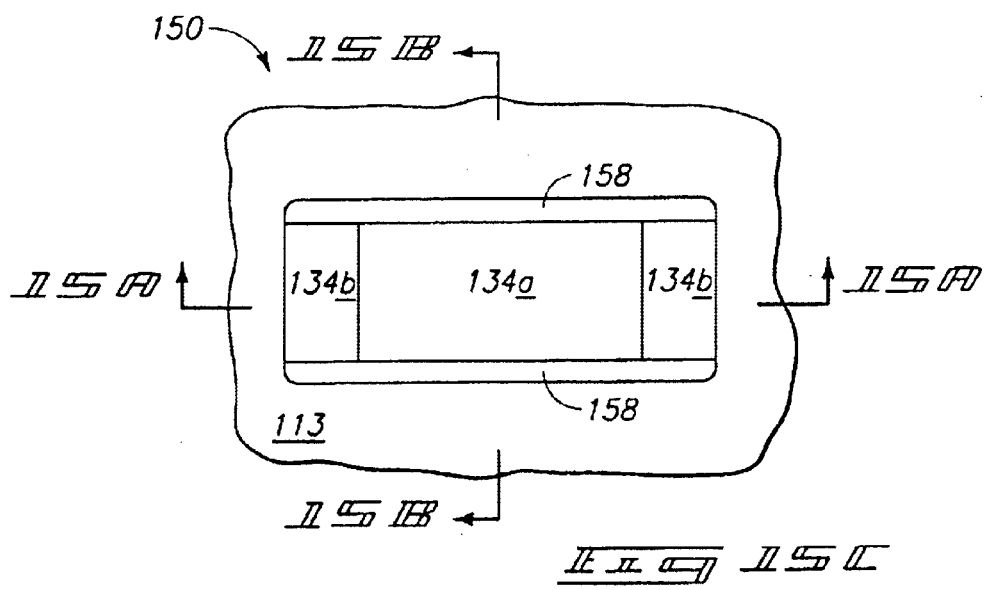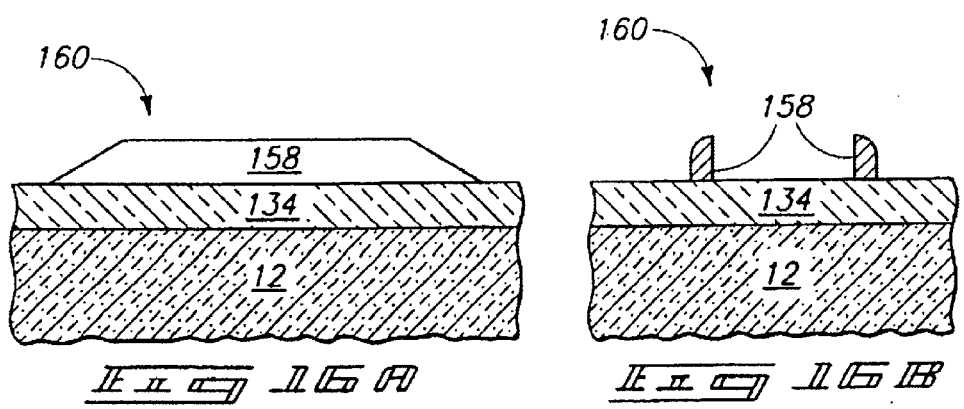

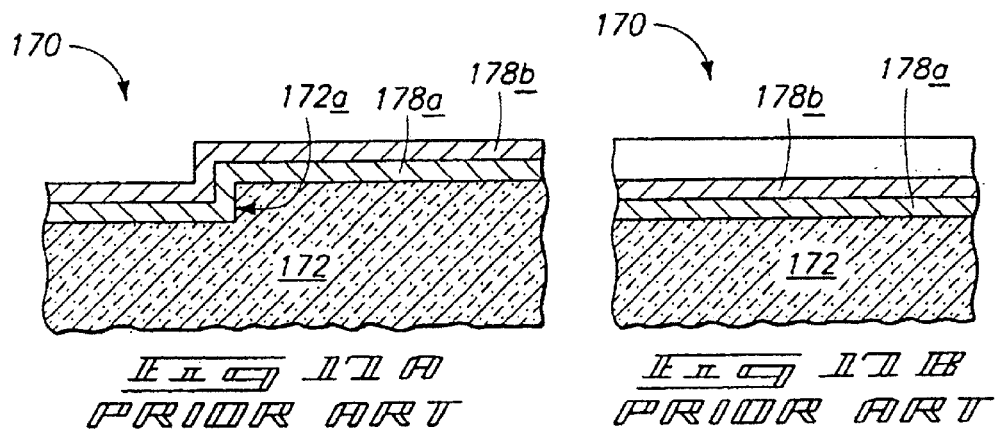
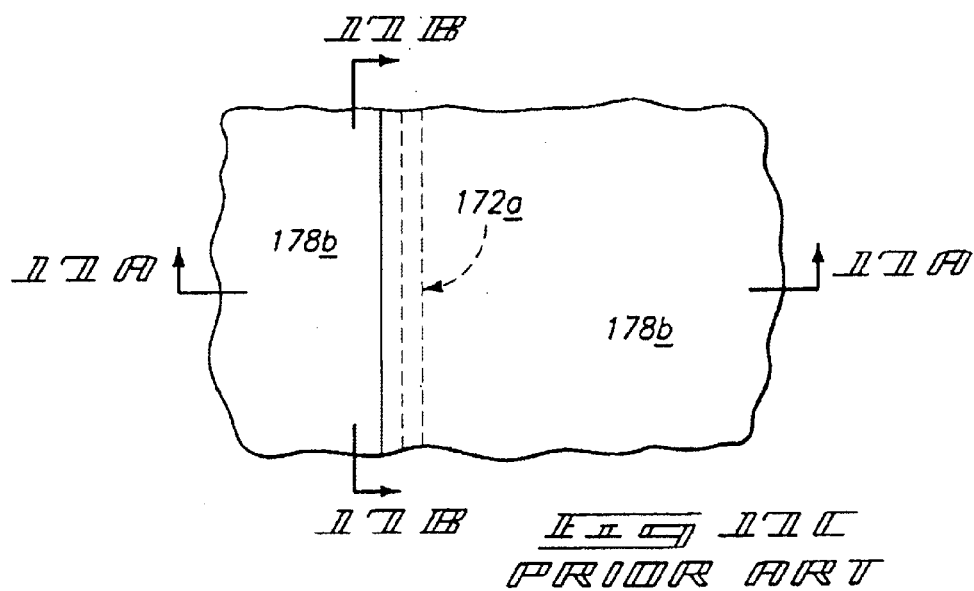
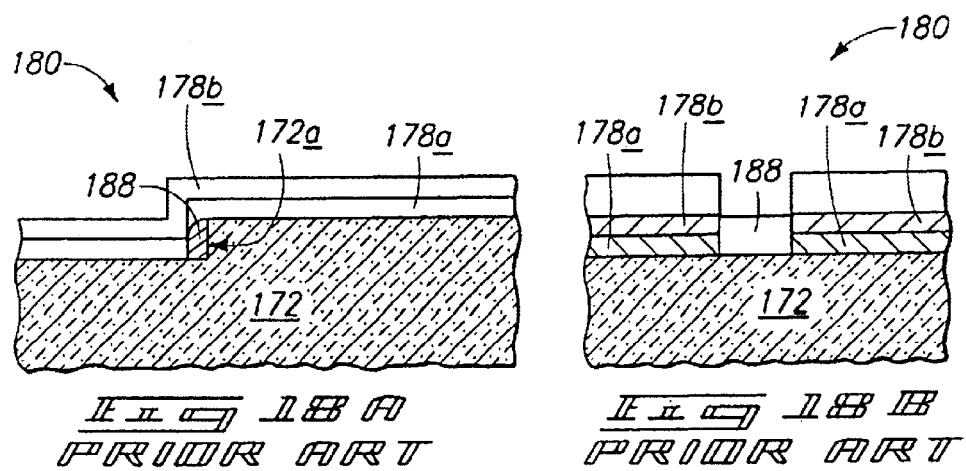

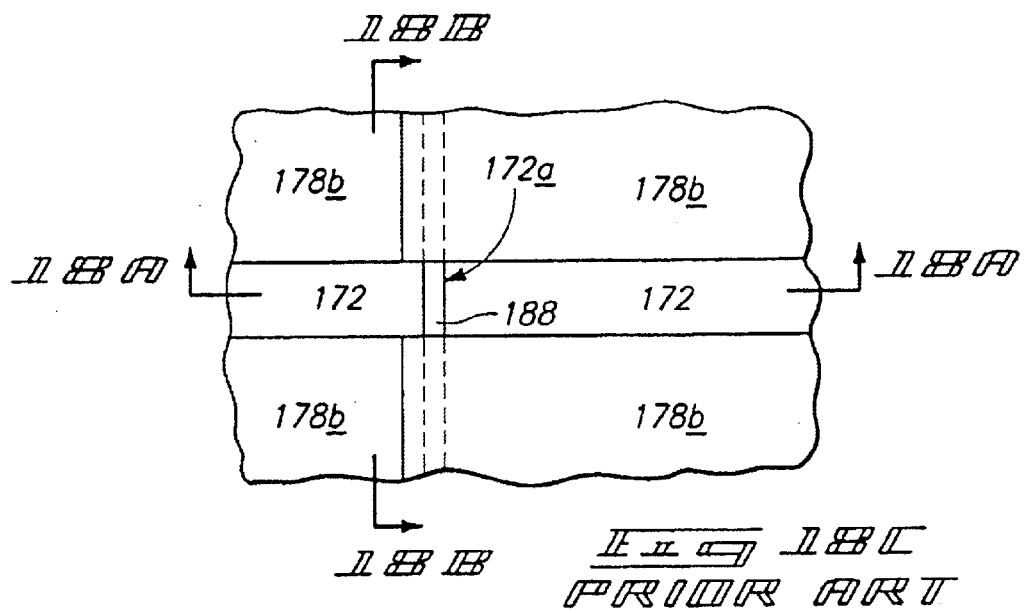
Fig 18C PRIOR ART
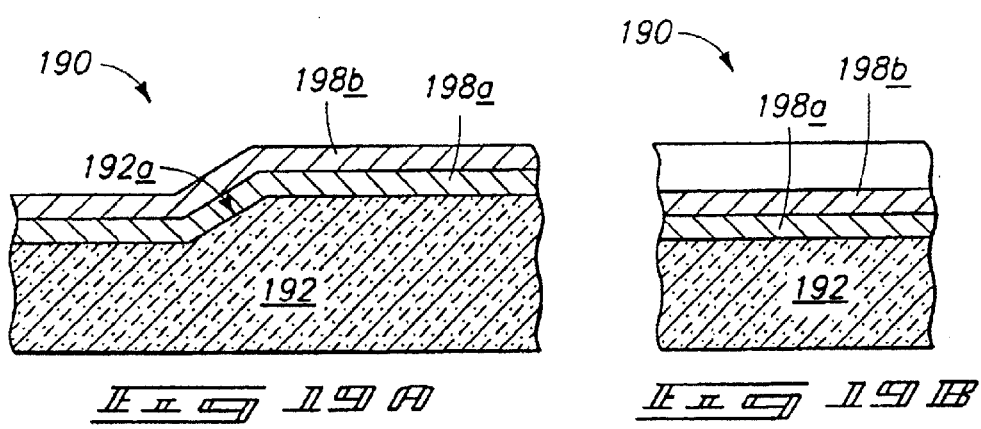
Fig 19A
Fig 19B
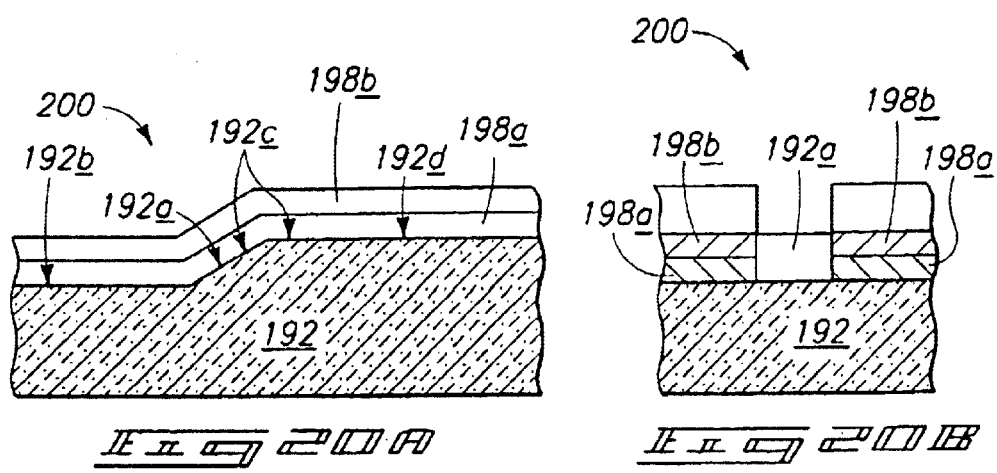
Fig 20A
Fig 20B

INTERMEDIATE CONSTRUCTION HAVING AN EDGE DEFINED FEATURE This patent resulted from a divisional application of U.S. patent application Ser. No. 09/561,794 filed on May 1, 2000 which is a divisional of U.S. patent application Ser. No. 09/444,280 filed on Nov. 19, 1999, now U.S. Pat. No. 6,232,229, issued May 15, 2001.

TECHNICAL FIELD

This invention relates to methods of fabricating microelectronic devices, to integrated circuits, and to intermediate constructions of integrated circuits.

BACKGROUND OF THE INVENTION

When fabricating microelectronic devices, integrated circuits, and the like, successive layers of various materials are often formed over a substrate and portions of such materials are removed to yield the desired device features. Generally, only the first few layers are deposited on a completely planar surface. Thereafter, fabrication of device features begins and successive layers are formed over features and/or portions of the substrate of varying topography. Such changes in topography may be referred to as steps, gaps, lines, etc. Layers of material subsequently formed over such features may be said to possess a horizontal portion, generally parallel to the original planar substrate, and a vertical portion, generally perpendicular to the original planar substrate. Anisotropic, or directional, etching of such subsequent layers often is ineffective in completely removing the vertical portion of such layers. Accordingly, frequently a horizontal portion of a layer may be almost entirely removed while the vertical portion is largely unaffected. Essentially, such processing leaves a residual wall formed from the remaining vertical portion of the layer.

In some circumstances, the residual wall must be removed to yield the desired structure. For example, when forming conductive lines it is common to deposit a layer of barrier material over varying topography to protect against chemical reaction or diffusion. Thereafter, a layer of conductive material is formed. The two layers of material are then patterned to remove unwanted portions and leave behind a pattern of conductive lines comprising the barrier material and the overlying conductor. Anisotropic etching is often used to remove the undesired material. Unfortunately, a residual wall of one or both of the two layers is often left behind as a vertical portion of such layers. In this context, such residual walls may be referred to as shorting stringers. Such shorting stringers extend between conductive lines, resulting in electrical shorts. Accordingly, additional effort may be undertaken to remove shorting stringers and to avoid defects resulting therefrom.

In other circumstances, residual walls from a vertical portion of a layer may be used to an advantage. An edge defined feature (EDF) is a material that remains as a residual wall after anisotropic etching. The width of an EDF may be controlled by selecting the thickness of the deposited layer from which it resulted. The height of an EDF may be controlled by the height of the feature over which it was formed to yield the vertical portion. Accordingly, an EDF may be sublithographic. The original feature on which an EDF is formed may subsequently be removed to yield a freestanding EDF. The original feature essentially may act as a core around which the EDF is shaped and may be referred to as a mandril.

Despite the advantages of an EDF, there remain difficulties in processing. For example, generally it is not desired that every vertical portion remaining after anisotropic etching of a deposited layer function as an EDF. Accordingly, a subsequent mask of intended EDFs and etching of undesired vertical portions is required.

It would be an improvement in the art if the mask and etch step required to fully define an EDF could be eliminated, simplifying the formation process. It would also be an improvement to remedy the problem of shorting stringers or other residual walls that remain after anisotropic etching. Unless such difficulties are resolved, the processing methods described above will continue to require additional process steps to address such residual material.

SUMMARY OF THE INVENTION

In accordance with an aspect of the invention, a microelectronic device fabricating method includes providing a substrate having a beveled portion, forming a layer of structural material on the beveled portion, and removing some of the structural material from the beveled portion by anisotropic etching to form a device feature from the structural material. By way of example, only a portion of the structural material may be removed from the beveled portion such that a device feature is formed on the beveled portion. Such a device feature may include a pair of spaced, adjacent barrier material lines that are substantially void of residual shorting stringers extending therebetween. Also, an effective amount of the structural material may be removed from the beveled portion while remaining structural material forms an edge defined feature.

According to another aspect of the invention, an integrated circuit includes a semiconductive substrate, a layer of dielectric material over the substrate having a beveled edge, and a pair of spaced, adjacent, chemical reaction or diffusion barrier material lines. The lines extend over the beveled edge and are substantially void of residual shorting stringers.

In accordance with yet another aspect of the invention, an intermediate construction of an integrated circuit includes a semiconductive substrate and a raised mandril over the substrate. The mandril has a beveled edge and an edge substantially perpendicular to the substrate. A layer of structural material forms an edge defined feature on the perpendicular edge.

Other aspects of the invention may be apparent from the detailed description of preferred embodiments below.

BRIEF DESCRIPTION OF THE DRAWINGS

Preferred embodiments of the invention are described below with reference to the following accompanying drawings.

FIGS. 1A–C are enlarged sectional and top views of a prior art wafer portion at one processing step.

FIG. 2 is an enlarged top view of a prior art exposure mask portion.

FIGS. 4A–B, 5A–B, 6A–C, 7A–B, 8A–C, and 9A–B are enlarged sectional and top views of the wafer portion of FIGS. 3A–B, each subsequently numbered set of figures being at a process step subsequent to that depicted by its preceding numbered set of figures.

FIGS. 13A–B, 14A–B, 15A–C, and 16A–B are enlarged sectional and top views of the wafer portion of FIGS. 12A–B, each at a processing step subsequent to that depicted by its preceding numbered set of figures.

FIGS. 17A–C are enlarged sectional and top views of a prior art semiconductor wafer at one processing step.

FIGS. 18A–C are enlarged sectional views of the wafer portion of FIGS. 17A–C at a subsequent processing step.

FIGS. 19A–B are enlarged sectional views of a wafer portion at one processing step in accordance with the invention.

FIGS. 20A–B are enlarged sectional views of the wafer portion of FIGS. 19A–B at a subsequent processing step.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

FIGS. 1A–C and 3A–B through 9A–B depict a wafer portion 10 in a conventional process. Wafer portion 10 of FIGS. 1A–C includes a substrate 12 having a layer of an insulative material 14 formed thereon and a layer of a resist 16 formed on insulative material 14. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 3A:
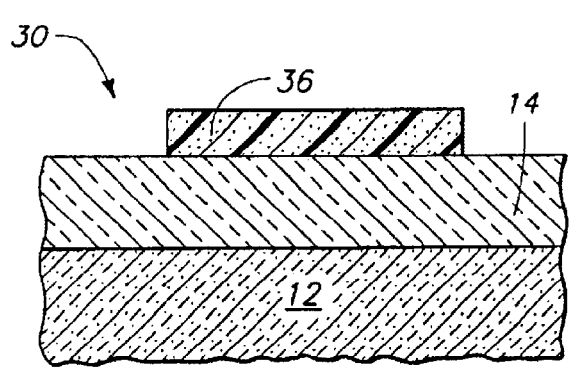
FIGS. 3A–B are enlarged sectional views of the wafer portion of FIGS. 1A–C at a process step subsequent to that depicted in FIGS. 1A–C.
Figure 3B:
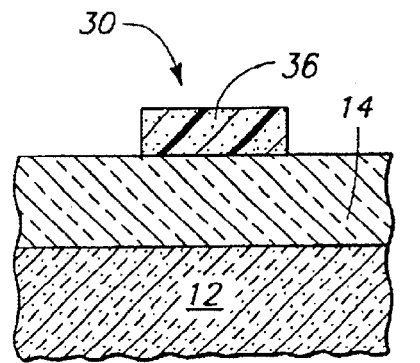
Figure 4A:
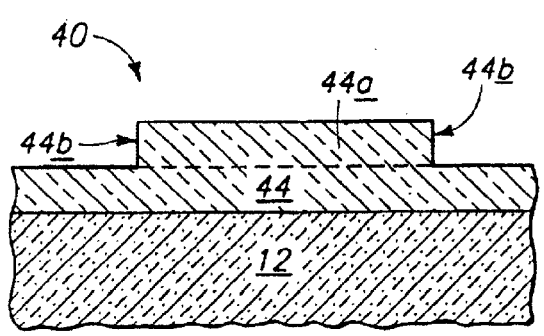
Figure 4B:
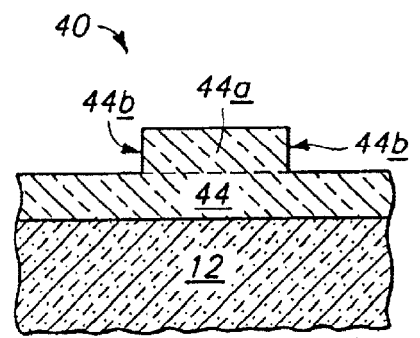

Wafer portion 10 may be exposed to actinic radiation using an exposure mask 20 illustrated in FIG. 2. Exposure mask 20 includes a blocking shape 21 and a transparent region 23. Assuming resist 16 is a positive resist, use of exposure mask 20 will yield a wafer portion 30 illustrated in FIGS. 3A–B. A resist mask pattern 36 is formed after development of exposed resist 16. Resist mask pattern 36 may then function as an etch mask such that subsequent etching will produce a wafer portion 40 of FIGS. 4A–B. Etching thus forms a mandril 44a in a patterned insulative material 44. Mandril 44a may then be used to fabricate an edge defined feature (EDF).

Figure 5A:
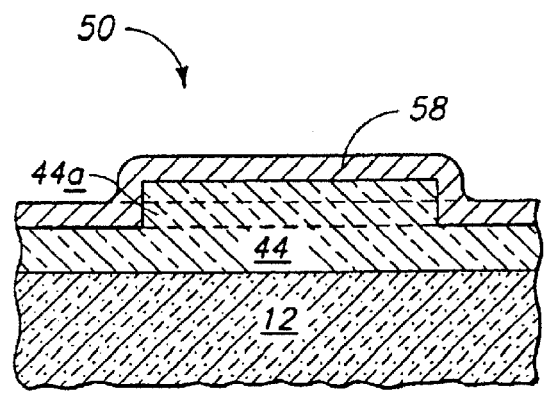
Figure 5B:
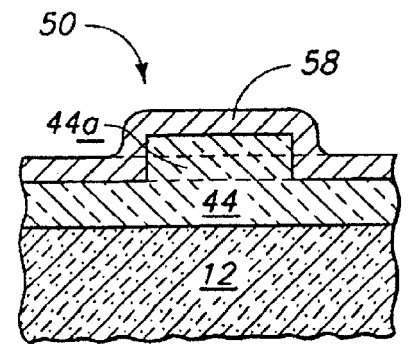
Figure 6A:
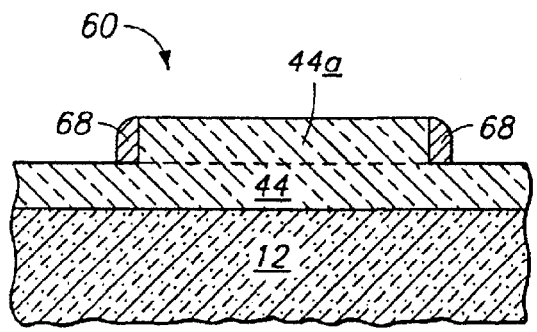
Figure 6B:
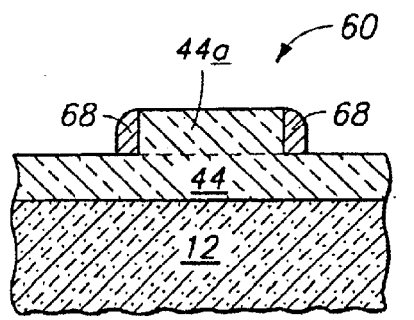
Figure 6C:
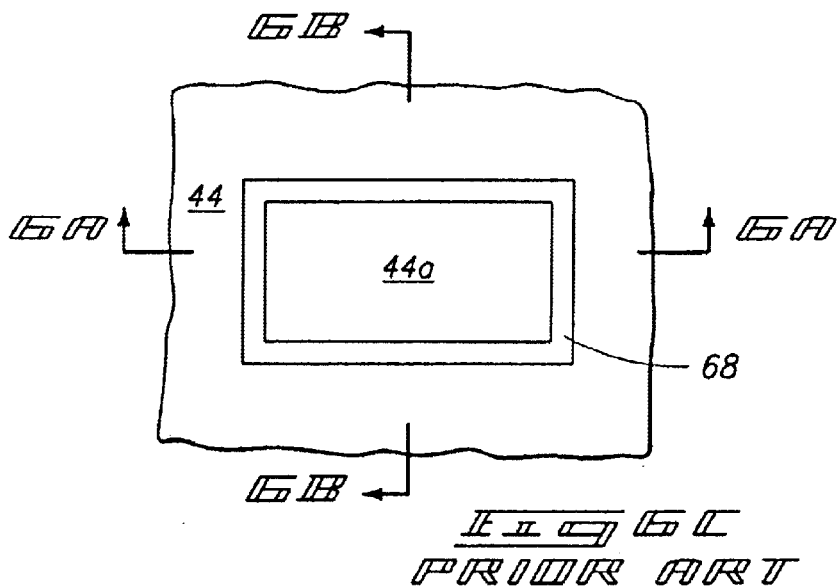

Formation of an EDF may involve depositing a layer of a structural material 58 over patterned insulative material 44 to form a wafer portion 50 shown in FIGS. 5A–B. FIGS. 6A–C illustrate wafer portion 60 after anisotropic etching of wafer portion 50 to remove all but the material desired to form an edge defined feature. Accordingly, a wafer portion 60 of FIGS. 6A–C comprises residual structural material 68 formed on a perpendicular portion 44b surrounding mandril 44a. Because residual structural material 68 surrounds mandril 44a, a portion may be removed to form an EDF. Removal of a portion is particularly pertinent when residual structural material 68 comprises a conductive material. Otherwise, a short is likely to exist within an EDF formed from conductive residual structural material 68.

Figure 7A:
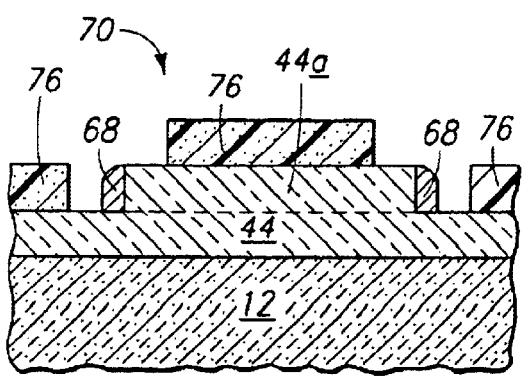
Figure 7B:
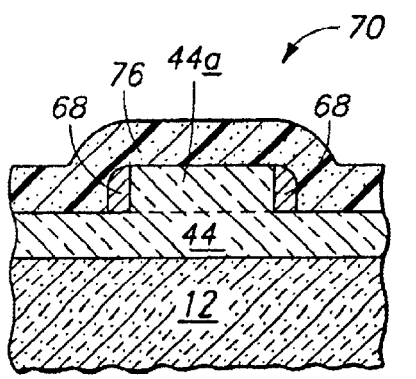

FIGS. 7A–B illustrate wafer portion 70 having a resist mask pattern 76 formed over patterned insulative material 44 such that a portion of residual structural material 68 is exposed while other portions destined to form an EDF are masked. After etching, a device feature 88 is formed as part of a wafer portion 80 shown in FIGS. 8A–B. A wafer portion 90 illustrated in FIGS. 9A–B is essentially the same as wafer portion 80, except that mandril 44a has been removed. Device feature 88 is left over the remaining portion of patterned insulative material 44.

As can be seen from the above processing method, an additional mask and etch step may be needed to remove undesirable portions of residual structural material 68 prior to producing a desired device feature 88.

Turning to FIGS. 17A–B, a similar conventional concept may be illustrated. A wafer portion 170 includes a substrate 72 shown as having a perpendicular portion 172a. A layer of a structural material 178a is formed on substrate 172, reflecting the contour of perpendicular portion 172a. A structural material 178b is also formed over substrate 172 and on structural material 178a, also reflecting the contour of perpendicular portion of 172a. FIGS. 18A–C illustrate wafer portion 170 after anisotropic etching to remove a portion of structural materials 178a and 178b. As expected from anisotropic etching, wafer portion 180 of FIGS. 18A–C includes a residual structural material 188 formed on stepped portion 172a.

The nature of anisotropic etching often results in formation of residual structural material 188. Formation of such material is particularly troublesome when structural materials 178a and/or 178b may be termed an etch resistant material. That is, a variety of etch processes exist and selection of a particular process may be influenced by a variety of factors. The etch resistance of a particular structural material is only one such factor. Thus, it is conceivable that an etch process will be selected that may be effective in removing certain areas of structural material but will be, to some degree, ineffective in removing other areas of structural material. Residual structural material 188 is one such area. If structural materials 178a and/or 178b are conductive, then residual structural material 188 may comprise a residual shorting stringer. Such residual shorting stringers typically may be removed to avoid defects in a resulting device feature.

The disadvantages of conventional processing methods discussed above may be remedied by the present invention. In one aspect of the present invention, a microelectronic device fabricating method includes providing a substrate having at least one beveled portion. Next, a layer of structural material may be formed on at least the at least one beveled portion and at least a portion of the structural material may be removed from the at least one beveled portion by anisotropic etching. Such a method may be used to form a device feature from the structural material.

Turning to FIGS. 19A–B, a wafer portion 190 is illustrated including a substrate 192 having a beveled portion 192a. Substrate 192 and beveled portion 192a may comprise a variety of materials and structures. For example, substrate 192 may comprise a layer of insulative material over a semiconductive wafer. Substrate 192 and beveled portion 192a may further comprise other layers, materials, and combinations thereof. Beveled portion 192a may be formed by the methods comprising one of the various aspects of the present invention or by other methods known to those skilled in the art now or in some future time.

One advantage of beveled portion 192a is that structural material formed thereon may be etched much more readily compared to structural material formed on perpendicular portion 172a shown in FIGS. 17A–B and 18A–B. Accordingly, the incidence of shorting stringers on beveled portion 192a may be reduced compared to the incidence of shorting stringer 188 on perpendicular portion 172a. Due to the nature of anisotropic etching, it is anticipated that the likelihood that shorting stringers may form on beveled portion 192a will decrease as the bevel of beveled portion 192a decreases. Accordingly, the bevel is preferably less than or equal to about 45°. That is, the angle of the bevel is preferably about 45° from horizontal or less. Clearly, some advantages of the present invention may nevertheless be realized even when the bevel exceeds about 45°. However, for some etch processes, it may be desirable that the bevel is less than or equal to about 45°.

Another advantage of providing beveled portion 192a is that improved control of feature size may be realized. The existence of residual structural material 188 on wafer portion 180 in FIG. 18A may warrant extended etching to alleviate the problem of shorting stringers. Extended etching can damage or distort device features formed from structural materials 178a and 178b. Beveled portion 192a allows structural material formed thereon to be etched more readily. Thus, extended etching can be reduced without concern for shorting stringers. In turn, minimizing the need for extended etching allows better control of feature size and quality by reducing damage and distortion of device features.

A structural material 198a of FIGS. 19A–B is one example of a suitable structural material. A structural material 198b is another example. Such structural material may be formed directly on substrate 192, and beveled portion 192a, or may simply be formed over beveled portion 192a. Successive layers of material formed over beveled portion of 192a may generally provide at least some bevel. Ultimately a bevel may be provided in an outermost layer exposed to anisotropic etching as well as underlying layers. Accordingly, when substrate 192 comprises a layer of insulative material over a semiconductive wafer, it is preferred that structural material 198a or 198b be formed over the insulative material. Structural material 198a or 198b may also be formed on the insulative material.

Because of the potentially wide application for the various aspects of the present invention, the structural material may comprise a variety of structures as well as a variety of materials. For example, forming the structural material may comprise depositing a substantially uniformly thick layer of structural material over the substrate. FIGS. 19A–B illustrate each of structural materials 198a and 198b as such a layer. Structural material 198a may comprise a chemical reaction or diffusion barrier material. Such a barrier material may be conductive. Such barrier materials may be used to protect underlying substrate 192 from chemical reaction with layers subsequently formed or from other substances with which substrate 192 is exposed. Such a barrier material may also prevent boron diffusion or other diffusion of unwanted species from subsequently formed layers into substrate 192. Structural material in 198b may comprise a conductive material used to form conductive lines in an integrated circuit or other microelectronic device. Barrier materials may comprise a variety of metal comprising oxides or metal comprising nitrides. One common example includes titanium nitride.

In one aspect of the present invention, the removing of structural material may comprise removing only a portion of the structural material from the at least one beveled portion to leave a pair of spaced, adjacent structural material lines on the at least one beveled portion. Turning to FIGS. 20A–B, a portion of structural materials 198a and 198b has been removed from substrate 192 and beveled portion 192a to form a space. Accordingly, it is conceivable that structural material 198a and 198b could form a pair of spaced, adjacent structural material lines on beveled portion 192a.

Conventionally, difficulty has been encountered in forming lines of chemical reaction or diffusion barrier material over lines, gaps, and other topography generically represented by perpendicular portion 172a of FIGS. 17A–B. During anisotropic etching to form spaced, adjacent barrier material lines, residual structural material 188 often remains following the etch. Such residual structural material 188 thus forms shorting stringers between barrier material lines. However, barrier material formed on beveled portion 192a may be etched to provide a device feature comprising a pair of spaced, adjacent, chemical reaction or diffusion barrier material lines which are substantially void of residual shorting stringers extending therebetween.

FIG. 20B illustrates that beveled portion 192a of substrate 192 is exposed following the etch of wafer portion 190 to form wafer portion 200. Of course, another aspect of the present invention alternatively provides that removing only a portion of the structural material from beveled portion 192a by anisotropic etching may be used to form other device features from the structural material on beveled portion 192a. Accordingly, the present invention is not limited to formation of structural material lines on beveled portion 192a. The various structural materials described above, including chemical reaction or diffusion barrier materials, may preferably be anisotropically etched after forming a resist mask pattern over the structural material and, with the masked pattern in place, performing the etch.

In keeping with the above described methods, an integrated circuit may be formed comprising a semiconductive substrate and a layer of dielectric material over the substrate. The dielectric material may have a base surface and a raised surface, the raised surface being raised out from the base surface and having at least one beveled edge and a step parallel to the base surface. A pair of spaced adjacent, chemical reaction or diffusion barrier material lines are further included with a portion extending over the at least one beveled edge from the base surface to the step of the raised surface. The spaced lines may be substantially void of residual shorting stringers extending therebetween. FIG. 20A illustrates substrate 192 as having a base surface 192b and a raised surface 192c. Raised surface 192c is raised out from base surface 192b and includes beveled portion 192a as described above. Raised surface 192c further provides a step 192d parallel to base surface 192b. Structural materials 198a and 198b may comprise chemical reaction or diffusion barrier material and may be patterned to provide a pair of spaced, adjacent lines with a portion extending over beveled portion 192a from base surface 192b to step 192d of raised surface 192c.

As illustrated in FIGS. 20A–B wafer portion 200 is substantially void of residual shorting stringers. The flow of current depends on the cross-sectional area of a conductor carrying such current. There may be some tolerance, depending on the application, for shorting stringers conducting negligible amounts of current in comparison to the current conducted through barrier material and/or associated conductive lines.

Figure 12A:
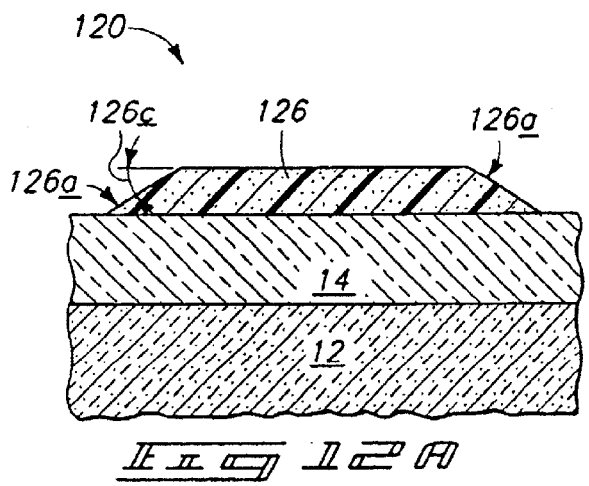
FIGS. 12A–B are enlarged sectional views of the wafer portion of FIGS. 1A–C at a processing step subsequent to that depicted by FIGS. 1A–C in accordance with the invention.
Figure 12B:
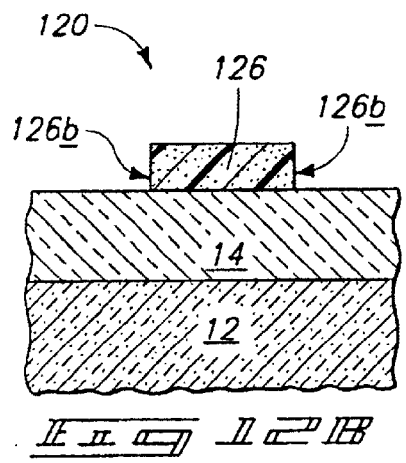

Turning to FIGS. 12A–12B, another aspect of the present invention is illustrated. As indicated above, a variety of substrates having a beveled portion may be of use in the present invention. In one exemplary microelectronic device fabricating method, a resist mask pattern may be formed on a substrate. The resist pattern may have at least one beveled portion at an edge of at least one opening in the resist pattern. The resist pattern may then be transferred to the substrate to form at least one beveled portion of the substrate. Subsequent processing proceeds as described earlier, forming a layer of structural material on the beveled portion and removing at least a portion of the structural material by anisotropic etching to form a device feature.

Figure 10:
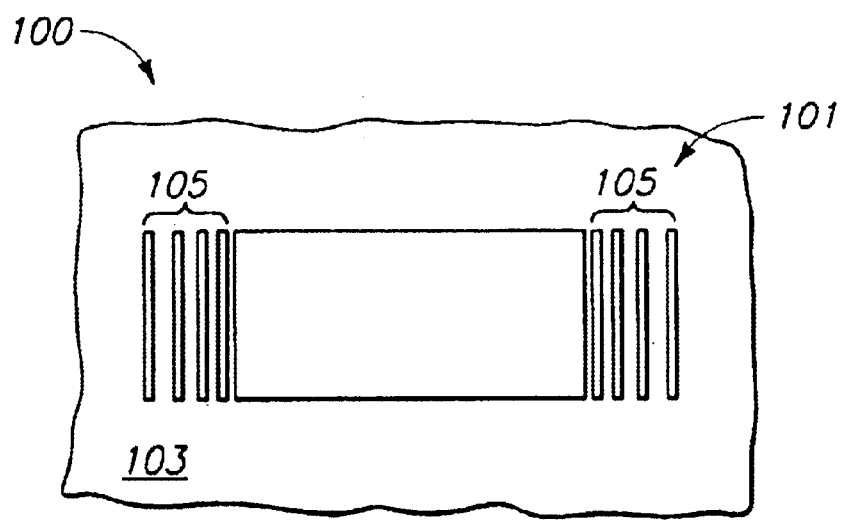
FIGS. 10 and 11 are enlarged top views of exposure mask portions in accordance with the invention.
Figure 11:
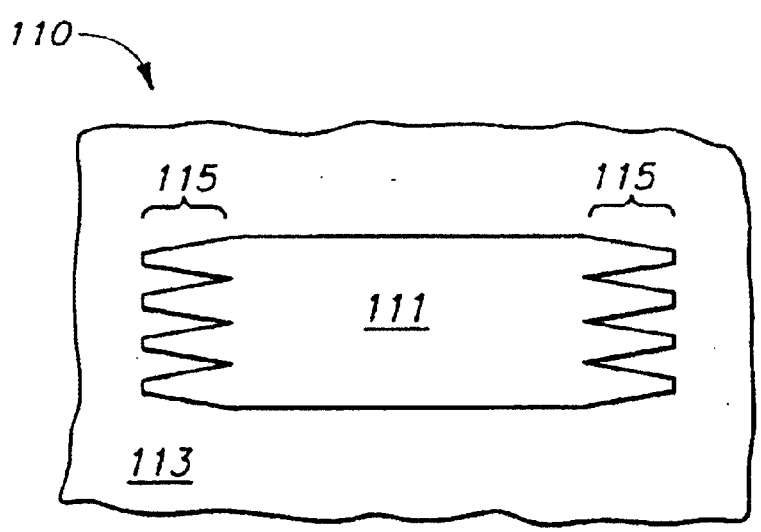

Wafer portion 10 of FIGS. 1A–C includes resist 16 formed over insulative material 14 on substrate 12. FIG. 10 illustrates an exposure mask 100 including a blocking shape 101 positioned within a transparent region 103. Blocking shape 101 includes a graded portion 105 for exposing a resist to actinic energy providing gradated exposure. That is, graded portion 105 includes alternating blocking shapes and transparent regions spaced and otherwise positioned such that exposure intensity is increased at the edges of blocking shape 101 compared to the center of blocking shape 101. The advantage of blocking shape 101 is that exposure intensity to actinic radiation may be gradually increased over a desired distance such that gradated exposure of a resist region occurs. FIG. 11 illustrates an exposure mask 110. Exposure mask 110 similarly includes blocking shape 111 positioned within a transparent region 113 and having a graded portion 115. Although different in structure from graded portion 105, graded portion 115 provides similar advantages. Alternatively, an otherwise solid blocking shape (not shown) could include openings formed therein of a designated size and position to accomplish similar advantages. A variety of other structures, devices, and exposure methods may be used to provide gradated exposure of a resist to actinic energy, whether currently known to those skilled in the art or later developed.

Exposure of resist 16 with an exposure profile similar to that produced either by exposure mask 100 or 110 may produce a resist mask pattern 126 of a wafer portion 120 illustrated in FIGS. 12A–B. Essentially, after exposure of resist 16 using an appropriate exposure method, resist 16 may be developed to remove a first region, revealing insulative material 14, and a portion of a second region subjected to gradated exposure, without revealing the substrate. A third region is left in place. Thus, resist mask pattern 126 is formed on a substrate and a beveled portion 126a forms in the second region subjected to gradated exposure.

FIG. 12B further illustrates that the exposure profile imposed on resist 16 produces a perpendicular edge 126b with respect to the surface of insulative material 14. Forming resist mask pattern 126 produces at least one beveled portion at an edge of at least one opening in resist mask pattern 126. The at least one opening occurs in the regions of resist removed to reveal the underlying insulative material 14 during develop. As discussed above for beveled portion 192a, beveled portion 126a of resist mask pattern 126 preferably has a bevel of less than or equal to about 45°. Such bevel is indicated in FIG. 12A as angle 126c. Nevertheless, angle 126c may also be greater than 45° in keeping with the above discussion.

Wafer portion 120 may be subjected to further processing to transfer resist mask pattern 126 to insulative material 14 to form at least one beveled portion of insulative material 14. Transfer of a resist profile to an underlying substrate may be performed according to any suitable method known to those skilled in the art at present or later developed. In one such method, transferring the profile of resist mask pattern 126 to insulative material 14 can be accomplished by an etch process that etches both materials. Some reactive ion etch processes can be capable of such an etch. If resist mask pattern 126 and insulative material 14 are etched at approximately the same rate, then the profile produced in insulative material 14 will substantially match the profile of resist mask pattern 126. As etch selectivity to insulative material 14 increases, the effectiveness of the profile transfer tends to decrease. If an etch affects insulative material 14 exclusively, then it is unlikely that beveled portion 126a of resist mask pattern 126 will transfer to insulative material 14. Accordingly, transfer of a resist bevel to an underlying layer can be described by the expression: tan(resist bevel)/tan(substrate bevel)=etch rate$_{resist}$/etch rate$_{substrate}$.

Figure 13A:
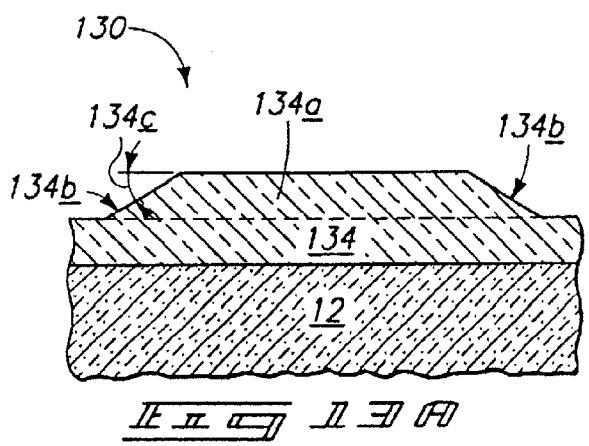
Figure 13B:
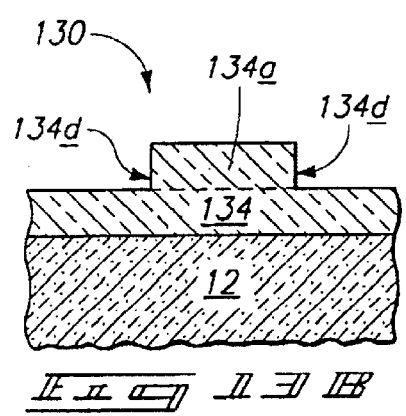

Turning to FIGS. 13A–B, a wafer portion 130 includes a patterned insulative material 134 resulting from transfer of resist mask pattern 126 to insulative material 14. Patterned insulative material 134 includes mandril 134a having a beveled portion 134b. Transferring of resist mask pattern 126 to insulative material 14 also transferred bevel portion 126a into beveled portion 134b. Beveled portion 134b has a bevel indicated in FIG. 13A by an angle 134c. Angle 134c is preferably approximately equal to 126c, however, it is acceptable that the process of transferring resist mask pattern 126 does not produce angle 134c precisely equal to angle 136C. Further, it may also be acceptable that a transfer process intentionally changes angle 134c such that it does not equal angle 126c. Angle 134c is preferably less than or equal to about 45°. Nevertheless, the advantages of the present invention may still be realized when angle 134c is greater than about 45° but less than 90°.

In one aspect of the invention, a substrate is provided with a base surface and a raised surface, the raised surface being raised out from the base surface and having at least one edge substantially perpendicular to the base surface and at least one beveled edge. In another aspect of the present invention, a raised mandril is provided over a substrate, the raised mandril being raised out from the substrate and having at least one edge substantially perpendicular to the substrate and having at least one beveled edge. Further, transferring the resist pattern may form a raised mandril from the substrate, the mandril having four edges including two edges substantially perpendicular to a recessed portion of the substrate and two beveled edges. As indicated previously, the substrate may comprise a semiconductive wafer, accordingly, the perpendicular edges may be substantially perpendicular to the semiconductive wafer.

Mandril 134a of patterned insulative material 134 provides one of many possible examples of a structure within the meaning of each of the above descriptions. Mandril 134a is raised out from a recessed portion of patterned insulative material 134. Insulative material may comprise the described substrate. Mandril 134a includes two beveled portions 134b or beveled edges. Mandril 134a further includes two perpendicular portions 134d or perpendicular edges. Perpendicular portions 134c are perpendicular with respect to both the recessed portion of patterned insulative material 134 and with the surface of underlying substrate 12.

Figure 14A:
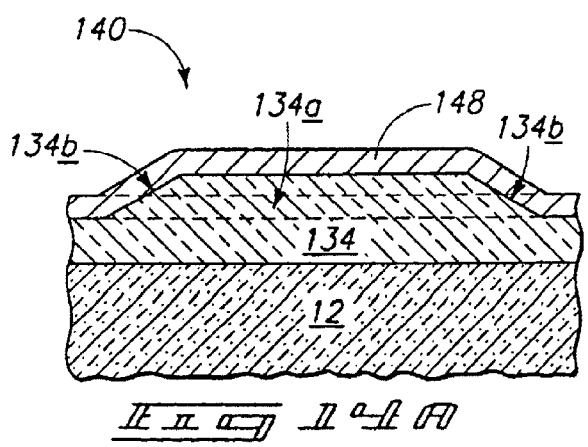
Figure 14B:
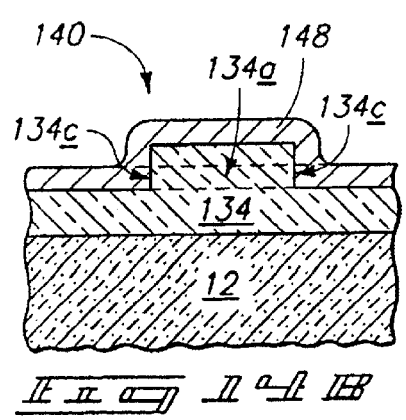

Turning to FIGS. 14A–B, a layer of structural material is formed on the at least one beveled portion of the substrate. More particularly, structural material 148 is deposited in a substantially uniformly thick layer over the entirety of mandril 134a, including beveled portions 134b and perpendicular portions 134d Alternatively, structural material 148 may be formed on at least the at least one beveled edge and the at least one perpendicular edge. The precise location wherein structural material 148 is formed will depend on the particular end result desired. As stated previously, structural material, including structural material 148, may comprise a variety of materials including conductive material, and chemical reaction or diffusion barrier material, among other materials.

For the formation of spaced, adjacent barrier material lines, it may not be necessary to form structural material 148 over perpendicular portions 134d. However, other device features may take advantage of perpendicular portions 134d to assist in formation of such features. In FIGS. 15A–C, structural material 148 of wafer portion 140 in FIGS. 14A–B has been anisotropically etched to remove at least a portion of the structural material from the at least one beveled portion and to form a device feature from the structural material. More specifically, structural material 148 has been anisotropically etched to remove an effective amount from patterned insulative material 134 and mandril 134a, including beveled portions 134b. An effective amount of structural material 148 is left on perpendicular portions 134d to form a device feature 158 of FIG. 16B on wafer portion 160.

Device feature 158 may comprise an edge defined feature (EDF), among other features. Such an edge defined feature may comprise conductive material as well as other materials. In another aspect of the invention, substantially all of structural material 148 may be removed from the at least one beveled portion, but at least a portion of the structural material may be left on another portion of the substrate. Such other portion may include perpendicular portions 134d, among other portions.

It is an advantage of the various aspects of the invention that anisotropic etching of structural material 148 removes such material from beveled portions 134b of mandril 134a without additional masking or etching. It is a disadvantage of conventional formation of EDFs that an additional mask and etch step may be required as illustrated in FIGS. 7A–B and the associated text above. Once the portions of structural materials 148 are removed, mandril 134a may be removed. Such removal may leave patterned insulative material 134 being essentially planar without any substantial patterned portions.

As illustrated in FIGS. 16A–B, device features 158 remain after removal of mandril 134a. Such edge defined features may be formed by methods in accordance with the various aspects of the present invention. A portion of mandril 134a may remain provided such is desired and/or any residual portions of mandril 134a do not interfere with later performance of device features 158. Of course, while anisotropic etching may be preferred to accomplish the advantages outlined above, other methods may be suitable to remove portions of structural material 148 while leaving behind other portions to form device feature 158 or other device features.

In yet another aspect of the present invention, an intermediate construction of an integrated circuit includes a semiconductive substrate, a raised mandril over the substrate. The raised mandril may be raised out from the substrate and have at least one edge substantially perpendicular to the substrate and have at least one beveled edge. A layer of structural material may form an edge defined feature on the at least one perpendicular edge. Further, the raised mandril may comprise four edges, including two edges substantially perpendicular to the substrate and two beveled edges. The advantages of such an intermediate construction are set forth above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An intermediate construction of an integrated circuit comprising:
    a) a semiconductive substrate;
    b) a raised mandril over the substrate, the raised mandril being raised out from the substrate and having at least one edge substantially perpendicular to the substrate and having at least one beveled edge; and
    c) a layer of structural material forming an edge defined feature on the at least one perpendicular edge.

2. The construction of claim 1, wherein the bevel is less than or equal to about 45°.

3. The construction of claim 1, wherein the raised mandril comprises four edges, including two edges perpendicular to the substrate and two beveled edges.

4. The construction of claim 1, wherein the structural material is conductive.

5. The construction of claim 1, further comprising a step at the at least one perpendicular edge from the substrate to the raised mandril.

6. The construction of claim 3, further comprising a step at each of the four edges from the substrate to the raised mandril.

7. The construction of claim 1, wherein the structural material layer comprises a substantially uniformly thick layer.

8. An intermediate construction of an integrated circuit comprising:
    a) a semiconductive substrate;
    b) a raised mandril over the substrate, the raised mandril being raised out from the substrate and having at least one edge substantially perpendicular to the substrate, at least one beveled edge, and a step parallel to the substrate; and
    c) a layer of structural material forming an edge defined feature on the at least one perpendicular edge, but not on the beveled edge or the step.

9. The construction of claim 8, wherein the edge defined feature extends to a full lateral extent of the perpendicular edge.

10. The construction of claim 8, wherein the edge defined feature extends to a full vertical extent of the perpendicular edge.

11. The construction of claim 8, wherein the bevel is less than or equal to about 45°.

12. The construction of claim 8, wherein the raised mandril comprises four edges, including two edges perpendicular to the substrate and two beveled edges.

13. The construction of claim 8, wherein the structural material is conductive.

14. The construction of claim 8, further comprising a step at the at least one perpendicular edge from the substrate to the raised mandril.

15. The construction of claim 12, further comprising a step at each of the four edges from the substrate to the raised mandril.

16. The construction of claim 8, wherein the edge defined feature comprises a substantially uniformly thick layer.

17. An intermediate construction of an integrated circuit comprising:
    a) a semiconductive substrate;
    b) a raised mandril over the substrate, the raised mandril being raised out from the substrate and having at least one edge perpendicular to the substrate and at least one beveled edge; and c) a layer of structural material forming an edge defined feature on the at least one perpendicular edge, the edge defined feature extending to a full lateral extent of the perpendicular edge.

18. The construction of claim 17, wherein the edge defined feature extends to a full vertical extent of the perpendicular edge.

19. The construction of claim 17, wherein the bevel is less than or equal to about 45°.

20. The construction of claim 17, wherein the raised mandril comprises four edges, including two edges perpendicular to the substrate and two beveled edges.

21. The construction of claim 17, wherein the structural material is conductive.

22. The construction of claim 17, further comprising a step at the at least one perpendicular edge from the substrate to the raised mandril.

23. The construction of claim 20, further comprising a step at each of the four edges from the substrate to the raised mandril.

24. The construction of claim 17, wherein the edge defined feature comprises a substantially uniformly thick layer.

* * * * *